United States Patent
Washimoto

[19]

[11] Patent Number: 6,048,082
[45] Date of Patent: Apr. 11, 2000

[54] DIRECT-MOUNTING ELECTRIC LAMP UNIT

[75] Inventor: Takashi Washimoto, Iwaki, Japan

[73] Assignee: Stanley Electric Co., Ltd., Japan

[21] Appl. No.: 09/100,720

[22] Filed: Jun. 19, 1998

[30] Foreign Application Priority Data

Jun. 20, 1997 [JP] Japan .................................... 9-164123

[51] Int. Cl.[7] ................................................. F21V 7/00
[52] U.S. Cl. .......................... 362/310; 362/255; 362/293; 362/439; 362/800
[58] Field of Search .................................. 362/310, 457, 362/226, 255, 293, 800, 439

[56] References Cited

U.S. PATENT DOCUMENTS

| | | | |
|---|---|---|---|
| 4,398,240 | 8/1983 | Savage, Jr. | 362/311 |
| 4,471,414 | 9/1984 | Savage, Jr. | 362/226 |
| 4,727,648 | 3/1988 | Savage, Jr. | 29/839 |
| 5,593,223 | 1/1997 | Kolzumi | 362/255 |
| 5,848,839 | 12/1998 | Saage, Jr. | 362/267 |

*Primary Examiner*—Sandra O'Shea
*Assistant Examiner*—John Anthony Ward
*Attorney, Agent, or Firm*—Ostrolenk, Faber, Gerb & Soffen, LLP

[57] ABSTRACT

A direct mounting lamp unit comprises a holder (4) each side of which is provided with a pair of terminal portions (5) having a shape such that a lead wire (2a) of a micro electric lamp (2) wound around the terminal portion (5) is substantially flush with a bearing surface (4a) of the holder (4). The lamp unit also comprises a color cap (3) that is provided with an engaging portion (3a) for engaging a lamp-receiving recess (4b) of the holder so that the micro electric lamp is kept vertically with respect to the bearing surface (4a) of the holder (4). The direct-mounting electric lamp unit having the above structure can be mounted on a circuit board (10) automatically by using a solder reflow bath in the same way as other electronic components, thereby improving productivity, though in the prior art, a direct-mounting electric lamp unit had to be mounted on a circuit board (10) by handwork.

6 Claims, 2 Drawing Sheets

DIRECT-MOUNTING ELECTRIC LAMP UNIT

BACKGROUND OF THE INVENTION

1. Field of the Invention

The present invention relates to an electric lamp unit for direct mounting. More specifically, the present invention relates to an electric lamp unit that can be mounted directly on a circuit board or other substrate, which may be used for disposing the electric lamp in a narrow space such as a control button of an audio system for a vehicle.

2. Background Art

FIGS. 3 and 4 show examples of such an electric lamp unit for direct mounting in the prior art. A direct-mounting electric lamp unit 90 shown in FIG. 3 comprises a micro electric lamp 91 and a color cap 92 for providing a desired color to the light emitted from the micro electric lamp 91. The color cap 92 has a bearing surface 92a by enlarging the outer diameter of the bottom portion of the color cap 92 or other means.

This direct-mounting electric lamp unit 90 is mounted on a circuit board 10 by inserting the lamp unit 90 into a mounting through hole 11 provided in the circuit board 10 from the backside of the circuit board 10, so that the bearing surface 92a of the color cap 92 contacts the circuit board 10, thereby the electric lamp unit 90 protrudes from the surface of the circuit board 10 by a predetermined height. In this state, lead wires 91a of the micro electric lamp 91 are soldered to the circuit board 10 to complete the mounting.

Another direct-mounting electric lamp unit 80 shown in FIG. 4 comprises a micro electric lamp 81, a color cap 82 and a holder 83 including a bearing surface 83a and a tube-like recess 83b for receiving the micro electric lamp 81 with the color cap 82. This direct-mounting electric lamp unit 80, in the same way as the above-mentioned electric lamp 90, is inserted into a mounting through hole 11 provided in the circuit board 10 from the backside of the circuit board 10, so that the bearing surface 83a contacts the circuit board 10. Thus, the electric lamp unit 80 protrudes from the surface of the circuit board 10 by a predetermined height. Then, lead wires 81a of the micro electric lamp 81 are soldered to the circuit board 10 to complete the mounting.

However, the direct-mounting electric lamps 90, 80 in the prior art mentioned above require soldering of the thin (e.g., 0.3 millimeters) lead wires 91a, 81a that are difficult to keep a desired figure, when the lamp units 90, 80 are mounted on the circuit board 10. The soldering process should be performed by hand, resulting in a problem of a low productivity in a whole assembling process of the circuit board 10 due to the mounting of the electric lamp units 90, 80.

Furthermore, in the direct-mounting electric lamp unit 90 shown in FIG. 3, the base portion of the micro electric lamp 91 is exposed when the electric lamp unit 90 is inserted into the mounting through hole 11 of the circuit board 10. Therefore, the electric lamp unit 90 is difficult to be mounted by an automatic insertion machine, for example, but should be mounted by handwork. As a result, the productivity is further lowered.

In addition, since the lead wires are soldered by handwork, a quality problem such that the micro electric lamp is fixed with slanting can be occurred when a pair of lead wires are applied with uneven tensions in the soldering process, for example.

SUMMARY OF THE INVENTION

A first object of the present invention is to provide a direct mounting electric lamp unit comprising a micro electric lamp, a color cap covering the micro electric lamp, and a holder having a lamp-receiving recess for receiving the color cap and the micro electric lamp, the holder having a bearing surface that contacts with the back surface of a circuit board when being inserted into a through hole provided in the circuit board, so that the color cap and the micro electric lamp in the lamp-receiving recess of the holder protrude from the surface of the circuit board by a predetermined height, wherein each end of the holder has a pair of terminal portions for winding a lead wire of the micro electric lamp, the surface of the lead wire wound thereon is substantially flush with the bearing surface, and the color cap has an engaging portion that engages the lamp-receiving recess of the holder to keep the micro electric lamp in the vertical position with respect to the bearing surface.

A second object of the present invention is to provide a direct mounting electric lamp unit having the above-mentioned structure and a window portion provided in the terminal portion. The window enables checking the contact state of the lead wire with the circuit board after mounting the direct mounting electric lamp unit on the circuit board.

Thus, the direct mounting electric lamp, which was depending on a manual work for mounting on the circuit board in the prior art, can be mounted automatically using solder reflow bath and other equipment in the same way as other electronic components of a chip-mount type, so that the productivity can be improved. A mounting precision is also improved since the mounting state is visible for checking.

BRIEF DESCRIPTION OF THE DRAWINGS

These and other objects and advantages of the present invention will become clear from the description with reference to the accompanying drawings, wherein.

DETAILED DESCRIPTION OF THE PREFERRED EMBODIMENTS

The present invention is described in detail hereinafter with reference to an embodiment shown in the accompanying drawings.

Figure 1:
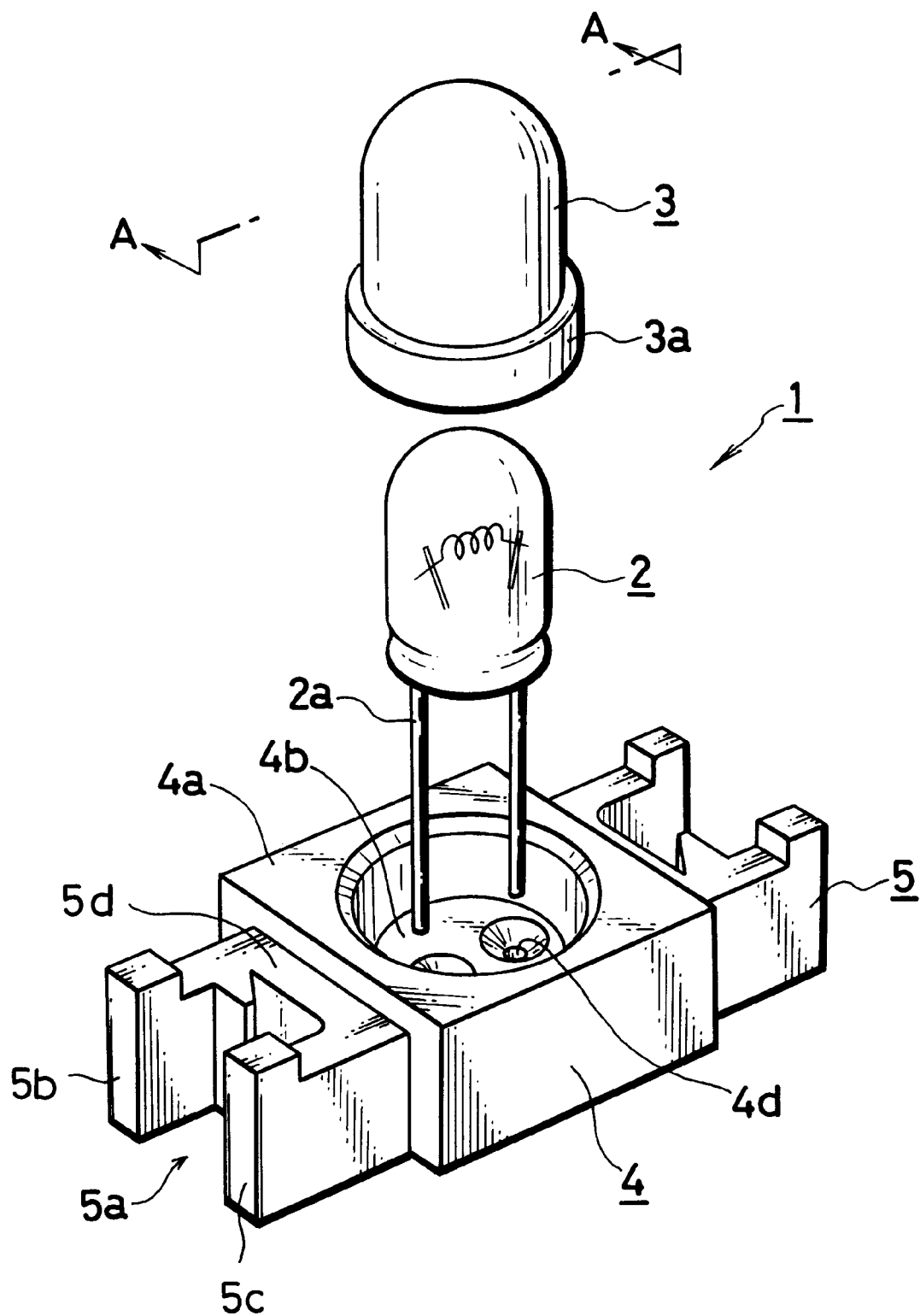
FIG. 1 is a perspective and partially exploded view of an embodiment of the direct mounting electric lamp unit according to the present invention.
Figure 2:
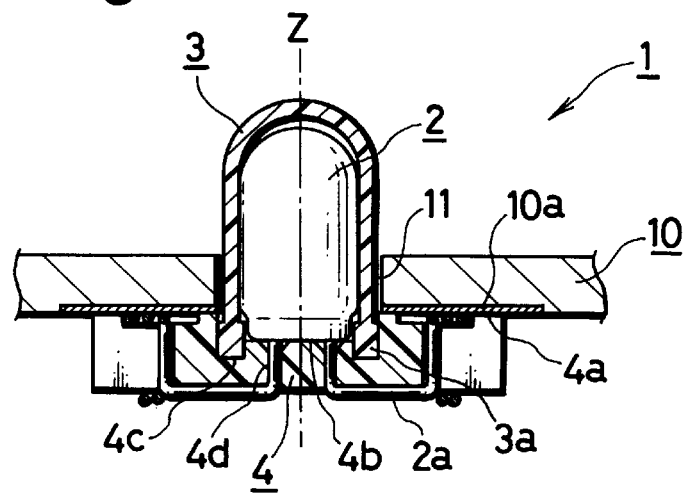
FIG. 2 is a cross section along A—A line in the FIG. 1.
Figure 3:
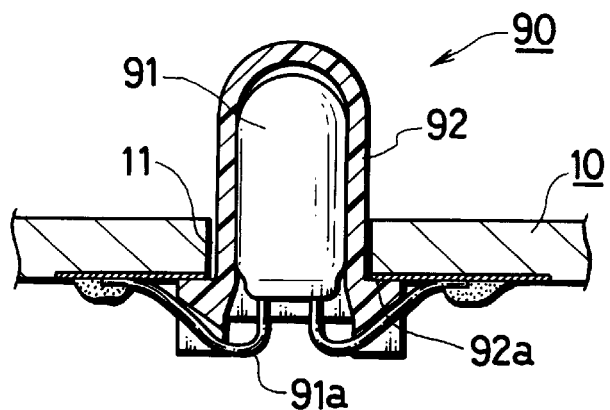
FIG. 3 is a cross section of an electric lamp unit in the prior art.
Figure 4:
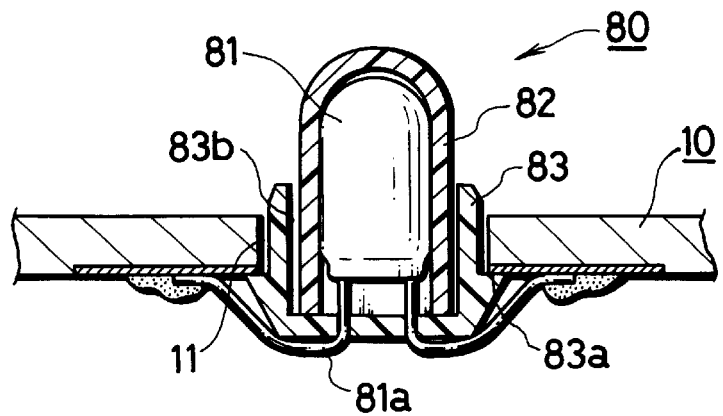
FIG. 4 is a cross section of another electric lamp unit in the prior art.

A direct mounting electric lamp unit according to the present invention is shown with a reference numeral 1 in FIGS. 1 and 2. This direct mounting electric lamp unit 1 comprises a micro electric lamp 2, a color cap 3 and a holder 4 in the same manner as the prior art shown in FIG. 4.

It is also the same as the prior art that the holder 4 in the present invention has a bearing surface 4a and a lamp-receiving recess 4b. However, in the present invention, the holder 4 has a pair of terminal portions 5 at each side for winding a lead wire 2a of the micro electric lamp 2 disposed in the lamp-receiving recess 4b.

The terminal portion 5 is provided with a step 5d corresponding to the diameter of the lead wire 2a that is wound around the terminal portion 5 within the step 5d. When the lead wire 2a is wound around the terminal portion 5, the upper surface of the lead wire is substantially flush with the bearing surface 4a. Thus, when the bearing surface 4a contacts with the back surface of a circuit board 10 as shown in FIG. 2, the lead wire 2a wound around the terminal portion 5 also contacts the back surface of a circuit board 10.

In the present invention, the terminal portion is provided with a window 5a as shown in FIG. 1, which is formed as a groove in a direction crossing the winding direction of the lead wire 2a at right angle, namely in a projecting direction of the terminal portion, and in a perpendicular direction to the circuit board 10. This window enables checking the contact or soldered state of the lead wire 2a with the circuit board 10 after mounting the electric lamp unit on the circuit board from the back side of the circuit board 10.

In this embodiment, the window 5a is formed like a groove. However, it is obvious that other shape of the terminal portion 5, for example, even if one of the terminal holding portions 5b and 5c is eliminated, can take the effect of the present invention as long as the lead wire 2a is securely held by the terminal portion 5 and contacts a predetermined portion of the circuit board 10 when contacting the back surface of the circuit board 10.

According to the present invention, the lamp-receiving recess 4b is provided with a cap-receiving portion 4c for engaging the color cap 3. In this embodiment, the cap-receiving portion 4c is formed in the bottom of the lamp-receiving recess 4b as a groove corresponding to the diameter of the lamp-receiving recess 4b.

On the other hand, the color cap 3 is provided with an engaging portion 3a that engages the cap-receiving portion 4c of the holder 4. When the engaging portion 3a engages the cap-receiving portion 4c, the color cap 3 is secured in the proper position, thereby the micro electric lamp 2 in the color cap 3 is secured such that the axis Z of the micro electric lamp 2 is perpendicular to the bearing surface 4a.

In the assembling process of the direct-mounting electric lamp unit 1 according to the present invention using the color cap 3 and the holder 4 mentioned above, the micro electric lamp 2 is inserted in the color cap 3 at first. Then the color cap 3 is inserted in the lamp-receiving recess 4b so that the cap-receiving portion 4c and the engaging portion 3a are engaged with each other.

A pair of lead wires 2a of the micro electric lamp 2 penetrate through holes 4d of the holder 4 and protrude from the back surface of the holder 4. Then the protruding lead wires 2a is wound around each of the terminal portions 5 to complete the assembling process of the direct-mounting lamp unit 1.

In the mounting process of the direct-mounting lamp unit 1 onto the circuit board 10, a transport step can lie between the step for setting the lamp unit 1 at a predetermined position on the circuit board 10 and the step for fixing the lamp unit 1 to the circuit board 10 by soldering or other means. Therefore, it is preferable to provide means for engaging the mounting through hole 11 to the holder 4 or the color cap 3 so that the predetermined position can be kept during the transport step.

An action and effect of the direct-mounting lamp unit 1 according to the present invention will be explained below. When the direct-mounting lamp unit 1 of the present invention is mounted on the circuit board 10, the color cap 3 (i.e., the lamp portion) is inserted into the mounting through hole 11 from the backside of the circuit board 10 until the bearing surface 4a contacts the back surface of the circuit board in the same way as the prior art.

Since the direct-mounting lamp unit 1 has a holder 4, it can be inserted into the mounting through hole 11 by using an automatic insertion machine having a vacuum chuck, for example. Thus, the direct-mounting lamp unit 1 can be mounted to the predetermined position on the circuit board 10 in the same way as other chip-mount electronic components.

In addition, since each side of the holder 4 is provided with the terminal portion 5 on which the lead wire 2a is wound in such a way that surface of the wound lead wire 2a is substantially flush with the bearing surface 4a according to the present invention, the lead wire 2a also contacts the back surface of the circuit board 10. Therefore, if a conductive land 10a is located at the position on the circuit board 10 corresponding to the lead wire 2a, the conductive land 10a contacts the lead wire 2a.

Then, the circuit board 10 passes through the solder reflow bath or other proper means, so that the direct-mounting lamp unit 1 is connected to the circuit board 10 automatically without handwork. Thus, the productivity is improved and a low quality such as an incorrect fixing position can be prevented. Furthermore, since the terminal portion 5 is provided with the window 5a, the soldered state can be checked easily in a visual inspection or other steps.

Adding to the above-mentioned merit of automatic mounting without hand soldering, a micro electric lamp 2 having an unstable size of stem portion contacting the holder can be kept securely in the proper position since the engaging portion 3a of the color cap 3 engages the holder 4 properly and the micro electric lamp 2 is held in the color cap 3.

The color cap 3 preferably has a proper hardness for holding the micro electric lamp 2 properly. According to the inventor's experiment, using a silicone elastomer for making the color cap 3, it is confirmed that 70 degrees of hardness is suitable for secure holding.

As explained above, firstly the present invention provide an excellent effect that a direct-mounting type of electric lamp unit, which was mounted on a circuit board by handwork in the prior art, can be mounted automatically by using solder reflow bath in the same way as other electronic components, thereby improving productivity.

Secondly, adding to the above-mentioned automatic mounting, the present invention can provide another excellent effect that a mounting accuracy of the lamp toward the circuit board is improved since the micro electric lamp is not positioned at an unstable size of stem portion but is held in the color cap.

While the presently preferred embodiments of the present invention have been shown and described, it will be understood that the present invention is not limited thereto, and that various changes and modifications may be made by those skilled in the art without departing from the scope of the invention as set forth in the appended claims.

What is claimed is:

1. A direct-mounting electric lamp unit, comprising:

a micro electric lamp; lead wires from the lamp;

a color cap holding the micro electric lamp;

a holder having:

a bearing surface with a lamp-receiving recess therein, the recess receives the color cap and the micro electric lamp which project above the bearing surface, and the bearing surface being adapted to that contact a back surface of a circuit board when the lamp unit is inserted in a mounting through hole of the circuit board from the back side of the circuit board, so that the color cap and the micro electric lamp received in the lamp-receiving recess of the holder also protrude from the front side of the circuit board by a predetermined height;

the holder is provided with terminal portions at each side of the holder, a lead wire of the micro electric lamp is wound around the terminal portion at each side, the terminal portions being of such height with respect to the back surface of the circuit board and with respect to the thickness of the lead wires wound around the terminal portion at each side that the upper surface of the wound lead wires is substantially flush with the bearing surface; and the color cap is provided with an engaging portion that engages the lamp-receiving recess of the holder so that the micro electric lamp is kept perpendicular to the bearing surface.

2. The direct-mounting electric lamp unit according to claim 1, wherein the pair of terminal portions of the holder is provided with a step that is so shaped and is of such depth for holding the wound lead wire in such a way that the upper surface of the wound lead wire is substantially flush with the bearing surface of the circuit board.

3. The direct-mounting electric lamp unit according to claim 1, wherein the terminal portion is provided with a window that enables a visible inspection of the contact state of the lead wire with the circuit board when the lamp unit is mounted on the circuit board.

4. The direct-mounting electric lamp unit according to claim 2, wherein the terminal portion is provided with a window that enables a visible inspection of the contact state of the lead wire with the circuit board when the lamp unit is mounted on the circuit board.

5. In combination, the direct-mounting electric lamp unit according to claim 1 in combination with the circuit board having the back surface and the front surface, the holder bearing surface being positioned at the back surface of the circuit board and the circuit board having the mounting through hole through which the color cap and the lamp project, with the holder at the back surface of the circuit board, and wherein the circuit board is so shaped and the holder is so shaped that lead wires wound on the terminal portions contact the back surface of the circuit board.

6. The combination of claim 5, further comprising a respective conductive region positioned on the back surface of the circuit board for contacting the lead wires wound on the terminal portions when the holder is at the back surface of the circuit board.

* * * * *